(12) United States Patent
Galve Conde et al.

(10) Patent No.: US 12,265,143 B2
(45) Date of Patent: Apr. 1, 2025

(54) MAGNETIC RESONANCE IMAGING WITH ZERO ECHO TIME AND SLICE SELECTION

(71) Applicants: CONSEJO SUPERIOR DE INVESTIGACIONES CIENTÍFICAS (CSIC), Madrid (ES); UNIVERSITAT POLITÉCNICA DE VALÈNCIA, Valencia (ES)

(72) Inventors: Fernando Galve Conde, Valencia (ES); José Miguel Algarín Guisado, Valencia (ES); José Borreguero Morata, Valencia (ES); José María Benlloch Baviera, Valencia (ES); Joseba Alonso Otamendi, Valencia (ES)

(73) Assignees: CONSEJO SUPERIOR DE INVESTIGACIONES CIENTÍFICAS (CSIC), Madrid (ES); UNIVERSITAT POLITÉCNICA DE VALENCIA, Valencia (ES)

(*) Notice: Subject to any disclaimer, the term of this patent is extended or adjusted under 35 U.S.C. 154(b) by 137 days.

(21) Appl. No.: 17/928,485

(22) PCT Filed: May 31, 2021

(86) PCT No.: PCT/EP2021/064543
§ 371 (c)(1),
(2) Date: Nov. 29, 2022

(87) PCT Pub. No.: WO2021/245024
PCT Pub. Date: Dec. 9, 2021

(65) Prior Publication Data
US 2023/0204698 A1    Jun. 29, 2023

(30) Foreign Application Priority Data
Jun. 1, 2020    (ES) .................. ES202030504

(51) Int. Cl.
*G01R 33/48* (2006.01)
*G01R 33/50* (2006.01)

(52) U.S. Cl.
CPC ..... *G01R 33/4816* (2013.01); *G01R 33/4818* (2013.01); *G01R 33/50* (2013.01)

(58) Field of Classification Search
CPC . G01R 33/4816; G01R 33/4818; G01R 33/50
See application file for complete search history.

(56) References Cited

U.S. PATENT DOCUMENTS 5,103,175 A    4/1992  Kimmich
10,969,451 B1* 4/2021  Wiesinger ........ G01R 33/56527
(Continued)

OTHER PUBLICATIONS

Algari-n, J. M., et al. Simultaneous Imaging of Hard and Soft Biological Tissues in a Low-Field Dental MRI Scanner. arXiv.Org, May 4, 2020, arxiv.org/abs/2005.01462. (Year: 2020).*
(Continued)

*Primary Examiner* — Gregory H Curran
(74) *Attorney, Agent, or Firm* — Hayes Soloway PC

(57) ABSTRACT

A novel radio frequency sequence, suitable for performing Magnetic Resonance Imaging (MRI) of 2-dimensional (2D) slices of samples exhibiting short magnetization coherence times (i.e., hard tissues). The SS-ZTE pulse sequence contains the following steps: a) magnetizing all spins in the sample from a longitudinal direction to the transverse plane; b) exciting the 2D slice of interest, which comprises the selective locking of said 2D sample slice magnetization while spoiling the magnetization in the rest of sample volume; c) making the magnetization of the selected 2D slice impervious to reconfigurations of the magnetic field gradients from slice selection to encoding and readout; d) reading out of the free induction decay signal of the sample; e) repeating steps (a-d) with different readout directions, so
(Continued)

as to gather a corresponding number of radial spokes of the plane defined by the 2D sample slice.

17 Claims, 3 Drawing Sheets

(56) References Cited

U.S. PATENT DOCUMENTS

| | | | |
|---|---|---|---|
| 11,150,314 B2* | 10/2021 | Grodzki | G01R 33/5608 |
| 2012/0235681 A1* | 9/2012 | Stemmer | G01R 33/4835 |
| | | | 324/307 |

OTHER PUBLICATIONS

D. G. Cory, "Dante Slice Selection for Solid-State NMR Imaging", Journal, 1990, 554-550, vol. 90, Journal of Magnetic Resonance.

Markus Weiger, "Sweep MRI with Algebraic Reconstruction", Journal, 2010, 1685-1695, vol. 64, Magnetic Resonance in Medicine.

David M. Grodzki, "Ultrashort Echo Time Imaging Using Pointwise Encoding Time Reduction with Radial Acquisition (PETRA)", Journal, 2012, 510-518, vol. 67, Magnetic Resonance in Medicine.

Markus Weiger, "MRI with Zero Echo Time: Hard Versus Sweep Pulse Excitation", Journal, 2011, 379-389, vol. 66, Magnetic Resonance in Medicine.

Markus Weiger, "MRI with Zero Echo Time", Journal, 2012, 311-322, vol. 1, eMagRes.

R. A. Wind, "Spatial selection in NMR by spin-locking", Journal Letter, 1978, L223-L226, vol. 11, Journal of Physics C: Solid State Physics.

S. P. Cottrell, "Slice Selection Methods for the NMR Imaging of Solid Materials", Journal, 1991, 860-865, vol. 2, Measurement Science and Technology.

A. M. Waeber, "Pulse Control Protocols for Preserving Coherence in Dipolar-Coupled Nuclear Spin Baths", Article, 2019, 1-9, vol. 10, Nature Communications.

Jose M. Algarin, "Simultaneous Imaging of Hard and Soft Biological Tissues in a Low-Field Dental MRI Scanner", Article, 2020, 1-14, vol. 10, Scientific Reports.

* cited by examiner

MAGNETIC RESONANCE IMAGING WITH ZERO ECHO TIME AND SLICE SELECTION

CROSS-REFERENCE TO RELATED APPLICATIONS AND PRIORITY

This patent application claims priority from PCT Application No. PCT/EP2021/064543 filed May 31, 2021, which claims priority from Spanish Patent Application No. P202030504 filed Jun. 1, 2020. Each of these patent applications are herein incorporated by reference in their entirety.

FIELD OF THE INVENTION

The present invention relates to the field of nuclear Magnetic Resonance Imaging (MRI), which is based on the nuclear excitation of nuclear spins of an object with a radio frequency (rf) signal, and the reconstruction of images of the object as a result of the nuclear magnetic resonance signals generated due to the excitation. More specifically, the invention relates to a zero-echo time (ZTE) imaging method providing two-dimensional (2D) slice selection for rapid MRI of samples with short magnetization coherence times.

BACKGROUND OF THE INVENTION

In the field of MRI, the imaging protocols rely on the excitation and detection of the spin degree of freedom of nuclei in a sample or an object under study. When subject to an external magnetic field in a longitudinal direction, these nuclei have a magnetic energy proportional to the field strength, and a dipole moment which tends to align with the external magnetic field lines. If a radio frequency (rf) pulse with an orientation of 90° with respect to the magnetic field is applied to the sample, then the net magnetization tips down, so that the longitudinal magnetization disappears, and a transverse magnetization appears. Immediately after the pulse, the transverse component of the magnetization precesses at the Larmor frequency and, shortly afterwards, induces an alternating current which can be detected in a coil. The induced signal (detected for example with a rf receiver), better known as free induction decay (FID) signal, decays with a transverse relaxation time constant, known as $T2^*$. Sample temperatures lead to magnetic-dipole fluctuations, which constitute a noisy environment for the surrounding spins. As a result of this and other interactions, magnetization coherence (also known as spin coherence) decays exponentially according to $T2^*$, placing an upper bound to the time over which one can obtain sample information before having to re-excite it with rf radiation. Let us recall that magnetization coherence in MRI is the physical state when the sample spins line up and rotate with the same speed around the magnetic field direction in the classical sense. Quantum mechanically, coherence is the state where the spins oscillate between the different energy states (eigenstates) constructively (together with the same speed or phase). This coherence is destroyed due to intrinsic processes, such as e.g. dipole-dipole interactions and molecular tumbling, over a time T2 characteristic of the material, but also due to inhomogeneities in the main magnetic field B0, incorrect configuration of B0 or its gradients or susceptibility effects in borders between tissues. The latter effect further contributes to dephasing leading to a total, extrinsic and intrinsic, $T2^*$ time which is a sum of both effects. It also exists a magnetization relaxation in the longitudinal direction, described with another time constant, known as T1.

In many cases, including the vast majority of clinical applications of MRI, these spin-spin interactions are predominantly of the dipole-dipole type, for which the interaction strength strongly depends on the angle A between the line that connects the dipoles and the direction along which they point. In non-solid samples, A is continuously changing due to molecular motion, thereby averaging to an isotropic distribution, therefore suppressing the coupling between neighboring nuclei, and leading to strong signals which MRI scanners use for image reconstruction. This averaging effect does not take place in solids, though, since both nuclei and magnetic field are static in the laboratory reference frame.

As a result, MRI imaging of hard biological tissues remains technically challenging. In particular, the penetration of magnetic resonance in clinical dental applications is extremely limited, mostly due to the fact that dentin and enamel (the main constituents in human teeth) respond with extremely short-lived signals to MRI protocols. MRI imaging of samples with fleeting T2 requires spatial encoding and data acquisition to be started and completed rapidly after signal creation.

When it comes to describe MRI rf sequences, two main parameters are used: the echo time (TE), associated with the time between the application of the rf excitation pulse and the peak of the signal induced in the rf receiver, and the repetition time (TR), measured from the application of an excitation pulse until the application of the next one. The TR determines how much longitudinal magnetization recovers between each pulse whereas TE governs the transversal ($T2^*$) relaxation.

In order to read the fleeting signals from the hardest tissues, two families of rf pulse sequences are employed: SWeep Imaging with Fourier Transform (SWIFT) (see, for example, M. Weiger et al: "MRI with zero echo time: Hard Versus Sweep Pulse Excitation", Magnetic Resonance in Medicine, 66 (2011), 379-89) and zero-echo-time (ZTE) with hard rf pulse excitation (i.e. with pulses of rectangular form). ZTE sequences (as stated in M. Weiger et al: "Sweep MRI with Algebraic Reconstruction", Magnetic Resonance in Medicine, 64 (2010), 1685-95) are a robust, fast, and silent approach for three-dimensional (3D) imaging of samples with short T2. Both aforementioned pulse families rely on switching on encoding magnetic inhomogeneities (gradients) before the rf excitation pulse. Moreover, they pose engineering challenges: the former requires concurrent rf transmission and reception (thus, SWIFT sequences yield an initial acquisition dead time) whereas the latter needs a high power rf transmit line to achieve sufficient excitation bandwidth. Furthermore, SWIFT and ZTE share a common property: they are inherently volumetric sequences. Indeed, they encode spatial information of a 3D Field of View (FoV) and then mathematical algorithms can be used to reconstruct 3D objects.

Considering the fast decay of MRI signals in hard tissue imaging, a fast signal encoding and acquisition is mandatory, with no dead time between the excitation and MRI signal recording. A possible option to handle these requirements is using 3D radial center-out k-space encoding and the application of rf ZTE sequences, wherein the k-space is an array representing the spatial frequencies in a MRI image obtained, for example, by applying the Fourier transform to said MRI image. The central frequency corresponds to image contrast, so that the recovery of k-values around this point is critical. The goal of MRI is collecting the maximum amount of k-space (frequency space) content in order to reconstruct the 3D sample in a reliable way. It is worth pointing out that ZTE techniques minimize the dead time between excitation and acquisition, thus minimizing the gap at the center of the k-space. In particular, the Pointwise Encoding Time Reduction with Radial Acquisition (PE-TRA) technique (see, for instance, D. M. Grodzki et al: "Ultrashort Echo Time Imaging Using Pointwise Encoding Time Reduction with Radial Acquisition (PETRA)", Magnetic Resonance in Medicine, 67 (2012), 510-18) is able to overcome this limitation and filling pointwise the remaining dead time gap in the k-space.

Preliminary studies with the goal of bringing spatial, or slice, selection capability to MRI methods have been performed by other researchers. For example, various types of Spin-Locking (SL) sequences are disclosed in R. A. Wind et al: "Spatial Selection in NMR by Spin-Locking", Journal of Physics C, 11 (1978), L223-26. Particularly, SL begins with a conventional resonant $(\pi/2)_{x'}$ pulse that rotates the initial longitudinal (along the z axis) magnetization of the sample around a direction x' that precesses at the Larmor frequency in the laboratory frame of reference, and is therefore static in the rotating frame of the resonant radio-frequency excitation. Once the magnetization points along -y' direction which is at all times orthogonal to both x' and z, SL consists on the application of a longer, lock-field pulse around ±y'. If a linear magnetic inhomogeneity is applied during this pulse, the locking effect occurs only for a sample slice normal to the magnetic gradient for which the rf excitation is resonant. The rest of the spins of the sample 3D FoV dephase (lose their coherence) during the SL pulse, and in this way the slice selection can be implemented.

In the literature there exist many MRI sequences defined by different combinations of rf excitations and gradient pulses chosen to best suit the particular application. Among the standard MRI sequences, the Delay Alternating with Nutation for Tailored Excitation (DANTE) pulse sequences provide narrow-bandwidth coherent rotations with a combination of high-bandwidth pulses. In order to make this approach compatible with short T2 samples, the DANTE pulses can be merged with dipolar decoupling pulses based on MREV sequences (90° pulses which undo the effects of dipolar interactions at the end of the sequence), for instance, as in D. G. Cory et al: "DANTE Slice Selection for Solid-State NMR Imaging", Journal of Magnetic Resonance (1969), 90 (1990), 544-50.

Another example is the magnetization storage (MS) pulses applied to transfer transverse magnetization, which is subject to decoherence and T2* decay, to the longitudinal dimension z, where it is protected from decoherence and subject only to a slow relaxation characterized by another time constant, T1, much larger than T2*. After the MS pulse, which can be a simple $(\pi/2)_{-x'}$ if the magnetization points along -y', there is no spin precession and therefore no signal induced on the scanner detectors. However, magnetic field gradients can be switched on and off during this time without affecting the in-slice spins phases, which are meaningless when their magnetization is longitudinal, and can be used to dephase off-slice coherences.

In MRI field, it has recently been disclosed a particular pulse sequence devised and employed to remove simultaneously dipole-dipole interactions (thereby prolonging the coherence time of short-lived signals) and inhomogeneous dephasing, further referred to as Combined Hahn And Solid Echo (CHASE), as stated in A. M. Waeber et al: "Pulse Control Protocols for Preserving Coherence in Dipolar-Coupled Nuclear Spin Baths", Nature Communications, 10 (2019), 1-9. Its simplest version, CHASE-5, combines four solid echo pulses based on WAHUHA and MREV sequences with a single 180° pulse for dynamically rephasing the contribution from, e.g. unwanted magnetic field inhomogeneities. These five pulses in a CHASE-5 block may be considered as a single sub-block of a larger CHASE pulse block. For instance, a first CHASE-5 sub-block $\{(\pi/2)-x, (\pi/2)y, \pi x, (\pi/2)y, (\pi/2)x\}$ can be followed by a second CHASE-5 sub-block $\{(\pi/2)x, (\pi/2)-y, \pi-x, (\pi/2)-y, (\pi/2)-x\}$ to form a CHASE-10 pulse block, which corrects for finite pulse durations (CHASE-5 requires pulses much shorter than T2). Even longer pulse blocks can be engineered to incorporate further effects.

Although volumetric (3D) encoding is convenient in some scenarios, it is significantly faster to excite and obtain images of 2D slices of a sample (slice selection). At present, there exists no pulse sequence particularly designed for 2D slice selection of short-T2 materials or tissues. The above sequences, SWIFT and ZTE, are considered to be necessarily 3D and the only slice-selection procedure observed is unintentional and deleterious, due to insufficient rf bandwidth to excite the complete 3D FoV in ZTE. The object of the invention is able to address the aforementioned problem of 2D slice selection (SS) in MRI, and more particularly, for imaging samples with extremely short T2 (below 1 ms, i.e. hard tissue).

SUMMARY OF THE INVENTION

As it has been outlined in the previous section, the MRI image reconstruction of short T2-materials such as hard tissues is only possible for 3D FoV. The present invention overcomes the aforementioned limitation of the prior art by providing a method for 2D FoV (slice) selection based on a particular design of a ZTE pulse sequences, hereinafter referred to as Slice Selective Zero Time Echo (SS-ZTE).

In a first aspect, the invention provides a MRI method for imaging a 2D slice of a sample placed within a magnetic field (B0) oriented along a longitudinal direction, so that the magnetization of the sample is initially parallel to said direction of the magnetic field. This method is characterized by performing an imaging scan of a sample based on a ZTE sequence, wherein the imaging scan comprises the four following steps for a single radial spoke (considering a radial encoding direction in k-space, as in standard ZTE):

a) An excitation step comprises the onset of a slice selection gradient pulse ($G_{SS}$), which is responsible for selecting the 2D slice of the sample to be imaged, followed by at least one rf excitation pulse (B1) which provides a coherent rotation of the magnetization of all spins in the sample towards a plane transverse to B0; followed by the onset of a slice selection gradient pulse ($G_{SS}$) which is responsible for selecting the 2D slice of the sample to be imaged.

b) A slice selection step comprises selectively locking the sample magnetization so that only the 2D slice of choice remains excited within the FoV. In this way, in this step a sequence comprising at least one rf pulse is applied for selective locking (SL) of sample magnetization.

c) A preservation step, which comprises several rf and magnetic pulses engineered to preserve the 2D slice magnetization coherence while, at the same time, the selection gradient $G_{SS}$ is switched off and the image encoding gradient $G_{ro}$ is switched on, being the 2D slice magnetization coherence impervious to the latter operations of $G_{SS}$ and $G_{ro}$ reconfigurations.

d) A final step including acquisition of the FID signal provides the encoding for each radial spoke defined by $G_{ro}$.

Steps a)-d) are performed sequentially along several readout directions in order to gather a corresponding number of radial spokes in the k-space plane, with only the 2D slice of the sample contributing to the acquired signal. Finally, all the data collected from the magnetic FID signals and arranged in the k-space are used along with mathematical tools (e.g. inverse Fourier Transform) for reconstructing an image of the sample 2D slice.

Specific implementations of the slice selection (SS) step b) may include spin locking pulses, or DANTE sequences which merge excitation and slice selection in a combined sequence. Specific implementations of the preservation step c) could be based on Magnetization Storage pulses or CHASE sequences. The following paragraphs briefly describe some of these.

In a particular embodiment of the invention, the slice selection step b) can be implemented as a standard spin locking pulse (SL).

Another particular embodiment of the invention comprises a slice selection step b) with at least one rotary echo SL pulse. These sequences are divided into two segments with equal duration but opposed phase. The advantage of using them is to compensate the inhomogeneities of B1, which may induce artifacts in MRI reconstruction.

In another implementation of the invention, both the excitation step a) and the slice selection step b) can be merged into a unique homonuclear dipolar-decoupled version of the DANTE selective-excitation sequence. We recall that DANTE sequences consist of an alternating series of periods of free spin evolution and short hard rf pulses (i.e. rectangular pulses), so that their implementation in the rf transmitter is relatively simple. These sequences are able to slice-select a 2D slice of the sample, while keeping coherence of its magnetization.

In further embodiments of the present invention, the preservation pulse sequence of step c) starts with a hard rf pulse in order to rotate the transverse component of the magnetization to the longitudinal axis. Once the magnetization is longitudinal, the $G_{SS}$ gradient is ramped to zero and $G_{ro}$ is ramped in a perpendicular (image-encoding) direction. The presence of $G_{ro}$ enables the readout procedure in the acquisition step and also destroys remaining coherence outside the 2D slice d). Finally, with $G_{ro}$ at its target value, an excitation rf pulse is applied to the sample, thus rotating its net magnetization towards the transverse direction under a certain angle, better known as flip angle ($\theta_x$). This angle is often used to define the angle of excitation for a field echo pulse sequence. Actually, $\theta_x$ is the angle to which the net sample magnetization is rotated or tipped relative to the main magnetic field direction via the application of the rf excitation pulse at the Larmor frequency.

An alternative embodiment of the invention comprises a preservation step c), implemented with an MS pulse as in the previous paragraph, but comprising an additional spoiler gradient pulse, interleaved between the termination of $G_{SS}$ and the onset of $G_{ro}$, responsible for increased spoiling of the remaining magnetization outside said 2D slice which has not been completely lost during the large SL pulse from b).

An additional embodiment of the object of the invention comprises a SS-ZTE sequence in which the preservation step c) comprises a CHASE sequence. More particularly, this CHASE sequence can be a single CHASE-5 pulse train along where the slice selection gradient $G_{SS}$ is ramped linearly to zero before the first 90° pulse and blipped after the last one, and the readout gradient ($G_{ro}$) is first blipped and then ramped (contrary to $G_{SS}$), as in FIG. 4. This preservation step manages to keep the 2D slice magnetization coherent and in the transverse plane, while switching on (off) the encoding (slice-selection) gradient. Since magnetization is already transverse, encoding can start immediately without dead time. More complicated CHASE sequences, e.g. CHASE-10, can be used for further improvements on magnetization coherence. Also, more complicated ramping of $G_{SS}$ and $G_{ro}$ can be used, though one has to enforce that their respective time integrals are compensated along the CHASE sequence in each of quantum-spin directions, so that after the CHASE sequence no gradient-dephasing has occurred for the 2D selected slice.

Another particularly convenient implementation of the object of the invention comprises a preservation step c) implemented with an MS pulse and an acquisition step d) following a ZTE scheme. Because the MS step is followed by an excitation pulse, which rotates the 2D slice to a flip angle $\theta_x$, there is a dead time. Thus, a PETRA sequence can be further used for providing a better image reconstruction. This combination addresses the problem of the dead time, linked to the time needed for the rf electronics for switching between transmission and reception modes. This dead time hinders the acquisition of a certain range of data around the center of k-space, however, PETRA is able to overcome this constraint.

Another implementation of the object of the invention consists of a preservation step c) involving a CHASE sequence so that the dead time can be incorporated into the waiting time between pulses ($\tau$), hence enabling further reduction of acquisition time which is particularly critical for hard tissue imaging. This implementation is thus able to scan k-space without gaps in the center.

A further object of the invention refers to an MRI apparatus comprising:
- a magnet operable to provide a magnetic field (B0);
- a rf transmitter configured to transmit a rf field (B1) to a sample placed into the magnetic field;
- a rf receiver arranged to receive a magnetic resonance signal;
- a data acquisition unit to record the magnetic resonance signals; and
- means for processing the information provided by the data acquisition unit;

wherein, advantageously, the rf transmitter is configured to yield ZTE sequences according to any of the embodiments described, so that only a 2D slice of the sample acquires magnetization with the applied rf field.

It is also possible to have the rf transmitter and receiver integrated in the same physical element (rf coil).

A further object of the invention is the application of a MRI pulse sequence according to any of the previous embodiments to MRI imaging of the maxillofacial region for clinical dental applications, imaging of bones or tendons for physiotherapeutical applications, for which is particularly useful a MRI technique able to image samples exhibiting extremely short T2 times.

A last object of the invention involves the use of MRI pulse sequences according to any of the previous embodiments in order to image solid samples, which is particularly useful in any of the following fields: archaeology, mineralogy/gemology, soil prospection, analysis of precious minerals and analysis of chemical composition of solids.

BRIEF DESCRIPTION OF THE DRAWINGS

To complete the description and in order to provide for a better understanding of the invention, a set of drawings is provided. Said drawings form an integral part of the description and illustrate an embodiment of the invention, which should not be interpreted as restricting the scope of the invention, but just as an example of how the invention can be carried out. The accompanying drawings comprise specifically the following figures.

DETAILED DESCRIPTION OF THE INVENTION

Figure 1:
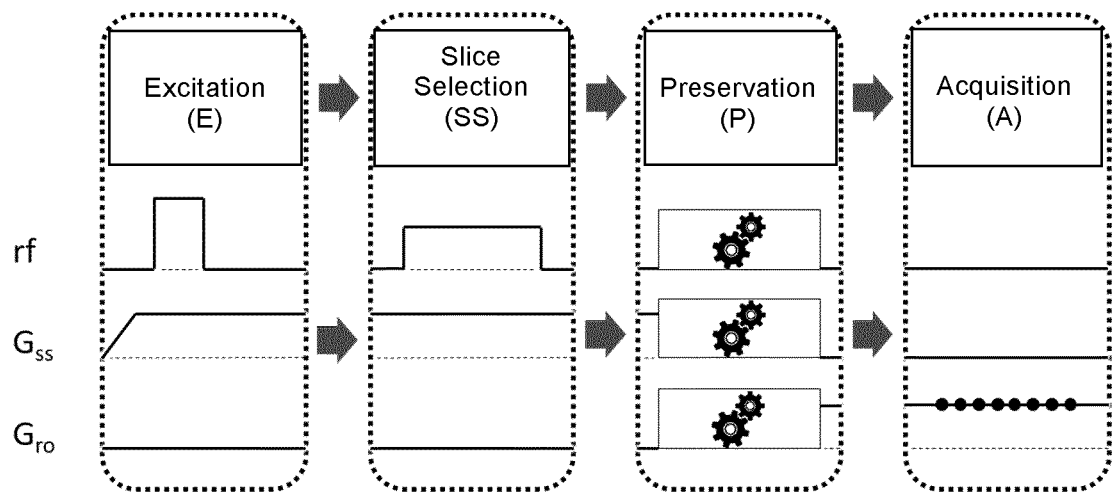
FIG. 1 is a block diagram showing a SS-ZTE sequence, and including sample radio frequency (rf) pulses, slice selection ($G_{SS}$) gradient pulses and readout ($G_{ro}$) gradient pulses according to an embodiment of the present invention.

FIG. 1 is a block diagram showing the SS-ZTE pulse sequence according to an embodiment of the present invention, comprising four main steps: an excitation (E) step, where the whole 3D FoV magnetization is rotated to the transverse plane; an slice-selection (SS) step, where the sample magnetization is selectively locked/spoiled, leaving solely excited the slice of choice; a preservation (P) stage, aimed to make the magnetization and coherence of the selected slice impervious to reconfigurations of the magnetic field gradients; and finally an acquisition (A) step, where the FID signal is detected, recorded and discretized. Every execution of the above procedure (each iteration comprises one execution of all the steps E, SS, P and A) provides data for a single radial spoke in a 2D k-space. For this reason, it is repeated with a plurality of readout ($G_{ro}$) directions in order to gather the corresponding number of radial spokes in k-space, with signal contributions coming only from the selected 2D slice of the sample. Then, mathematical tools are employed to reconstruct an image of the sample from the acquired data. Without loss of generality, one can choose x as the direction of the slice selection gradient, such that e.g. only the x=0 2D slice of the sample keeps coherent magnetization. Then, the preservation step is applied with a readout gradient $G_{ro}$ applied in the y-z plane, such that acquisition gives radial spokes in the k-space $k_y$-$k_z$. Mathematical tools are then able to reconstruct the image in y-z of the selected 2D slice.

In a first aspect, the present invention features the excitation step in a similar way to standard ZTE techniques, i.e., the hard rf excitation is pulsed only after the gradient field ($G_{ro}$) has been switched on. The rf pulse in the excitation step must coherently rotate the magnetization by 90° from the longitudinal direction (z) to an axis in the transverse plane, for the subsequent slice-selection step (SS) to work. Therefore, it does not necessarily determine the flip angle $\theta_x$, as later explained in the description of the preservation step (P). It is worth highlighting an important difference between the SS-ZTE and the conventional ZTE sequences: the direction of the slice-selection gradient field ($G_{SS}$) during the excitation step (E) eventually determines the slice selected in the former, rather than the readout direction as in the latter.

With regard to the slice-selection (SS) step, its aim is to selectively lock/spoil the sample magnetization, leaving solely the 2D sample slice of choice coherent.

Figure 2:
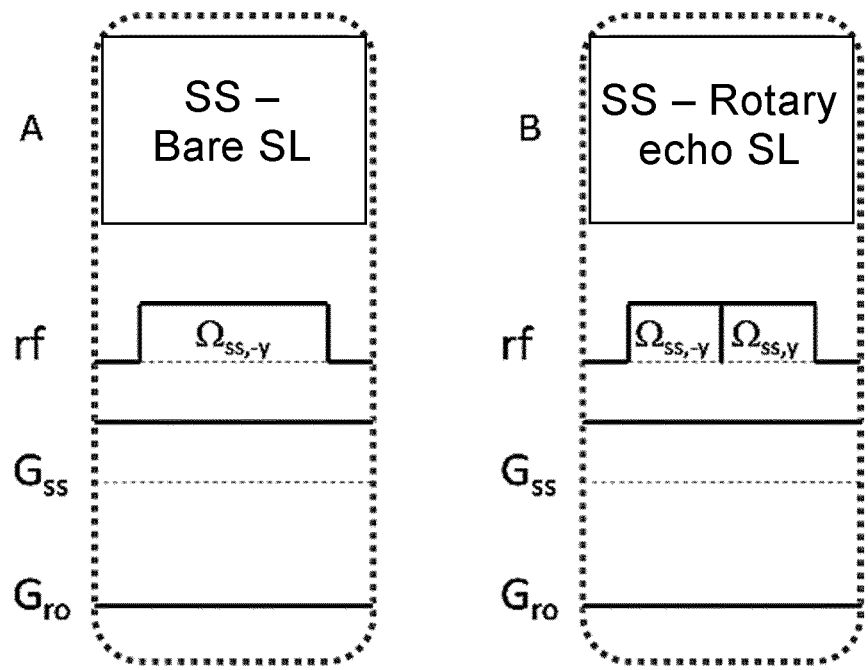
FIG. 2 displays two possible embodiments of the slice selection (SS) step shown in FIG. 1, either a bare selection locking (SL) pulse (A) or a rotary echo SL pulse (B), the latter being insensitive to rf excitation pulse (B1) inhomogeneities and suppressing in-slice dephasing.

In a preferred embodiment of the invention, the slice-selection (SS) step is performed with a bare (standard) spin-locking (SL) pulse, as shown in FIG. 2A. The magnetization in the slice of the FoV for which the SL pulse is resonant will be locked. The spins in the rest of the FoV are not resonantly excited and are therefore subject to dephasing at a rate T2*, accelerated by the presence of the slice-selection gradient field ($G_{SS}$). By considering, without loss of generality, that the excitation step leaves the magnetization pointing along -y', a bare SL pulse of frequency ($\omega$ss) and Rabi frequency ($\Omega$ss) around -y' (see FIG. 2A) will lock the spins with Larmor frequencies $\omega_L$ detuned by $|\delta v| \lesssim \Omega_{ss}$ from $\omega$ss, while spoiling (i.e. dephasing and spreading out in the transverse plane) the rest.

In another preferred embodiment of the invention, displayed in FIG. 2B, the slice-selection (SS) steps comprises using a rotary echo SL pulse, where the phase changes from the first to the second half to move the rotation axis from -y' direction to y'. This makes the SS step insensitive to rf field (B1) inhomogeneities, i.e. to spatial variations of the rf field amplitude and thus $\Omega_{ss}$. It also partially corrects dephasing for spin in the 2D slice which are not totally resonant to $\Omega$ss, improving the quality of the slice.

In a particularly advantageous embodiment of the invention, both the excitation (E) and slice-selection (SS) steps are merged into a unique homonuclear dipolar-decoupled version of the DANTE selective-excitation sequence. This technique interleaves WAHUHA or other decoupling pulse-sequences, between DANTE excitations which only excite the 2D resonant slice of the sample.

Meanwhile, the main challenge that SS-ZTE overcomes is how to switch from a gradient configuration which enables slice selection (out of plane) to an orthogonal configuration where a k-space radial spoke can be sampled (in plane), while preserving the magnetization coherence of short T2 samples. This task is performed by the preservation (P) step, which makes the magnetization and coherence of the selected slice impervious to reconfigurations of the magnetic field gradients. In its widest scope, the preservation (P) step comprises a combination of rf and gradient pulses which ensures that only the selected 2D slice of the sample will contribute to the detected FID signal.

In a preferred embodiment, the preservation (P) step starts with a hard rf pulse that rotates the transverse component of the magnetization to the longitudinal axis z. This MS pulse can be a simple 90° rotation around -x' ($90°_{-x'}$). Once the magnetization is longitudinal, the slice selection gradient ($G_{SS}$) is ramped to zero value without dephasing in-slice spins, while dephasing remaining coherences of off-slice spins. The readout gradient ($G_{ro}$) is ramped in a perpendicular (image-encoding) direction with regard to $G_{SS}$, in order to enable the ulterior acquisition in the corresponding step. Afterwards, an excitation rf pulse rotates the magnetization towards the transverse plane by an angle $\theta_x$ (flip angle)

which can be chosen different from 90°. This last step is in exact analogy to conventional ZTE.

Figure 3:
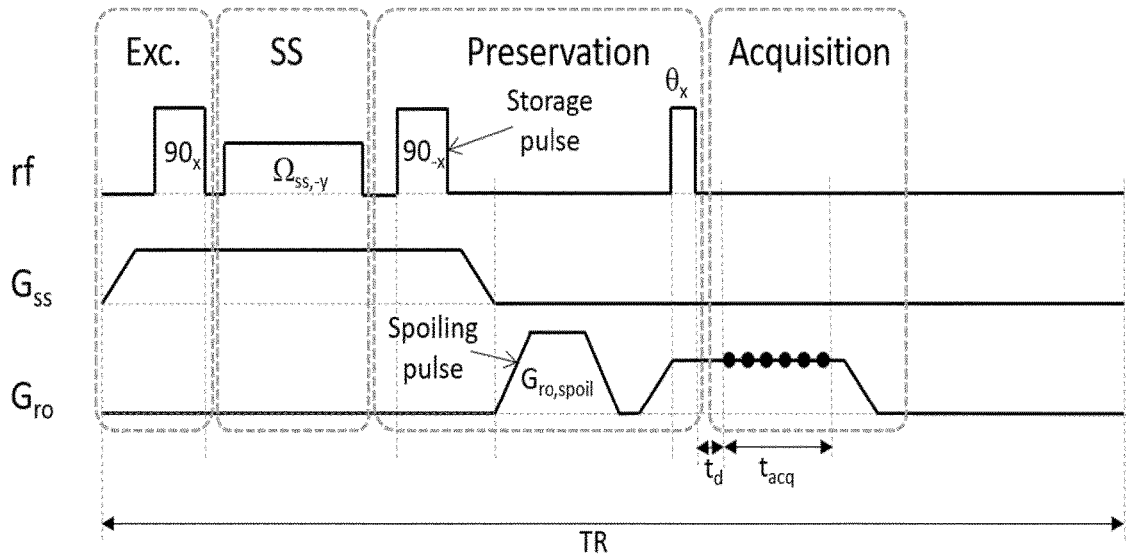
FIG. 3 shows a possible embodiment of the SS-ZTE sequence shown in FIG. 1, wherein the preservation (P) step comprises a magnetization storage pulse, a gradient spoiling pulse and an excitation pulse.

Another preferred embodiment of the invention, shown in FIG. 3 for a RT of the SS-ZTE sequence, comprises a preservation (P) step comprising a gradient spoiler pulse ($G_{ro, spoil}$) which is interleaved between the termination of the slice selection gradient pulse ($G_{SS}$) and the onset of the readout gradient ($G_{ro}$). This effectively further spoils (i.e. dephases) the contribution of spins outside the sample which have not completely lost their quantum coherence during the long SL pulse in the slice-selection (SS) step. For instance, this may occur if the sample is composed of a combination of tissues exhibiting both short and long coherence times, for instance, or if SL pulses are intentionally short to limit rf absorption by the sample.

In another preferred embodiment, the key element in the preservation (P) step is a Combined Hahn And Solid Echo (CHASE) sequence, with $G_{SS}$ starting on and $G_{ro}$ starting off, and both following trajectories in such a way that their time integrals after they have switched contribute to the inhomogeneous broadening terms in the Hamiltonian by exactly the same amount before and after the 180° pulses in the CHASE sub-steps, i.e. the time integrals must cancel for each of the spin operators. In this case, the 180° pulses suppress the dephasing otherwise introduced by the dynamic gradient fields, and the 90° pulse trains undo the contribution of dipolar interactions. All 180° and 90° pulses must be quasi-instantaneous (of duration much shorter than T2), and the final flip angle with CHASE is 90°.

Figure 4:
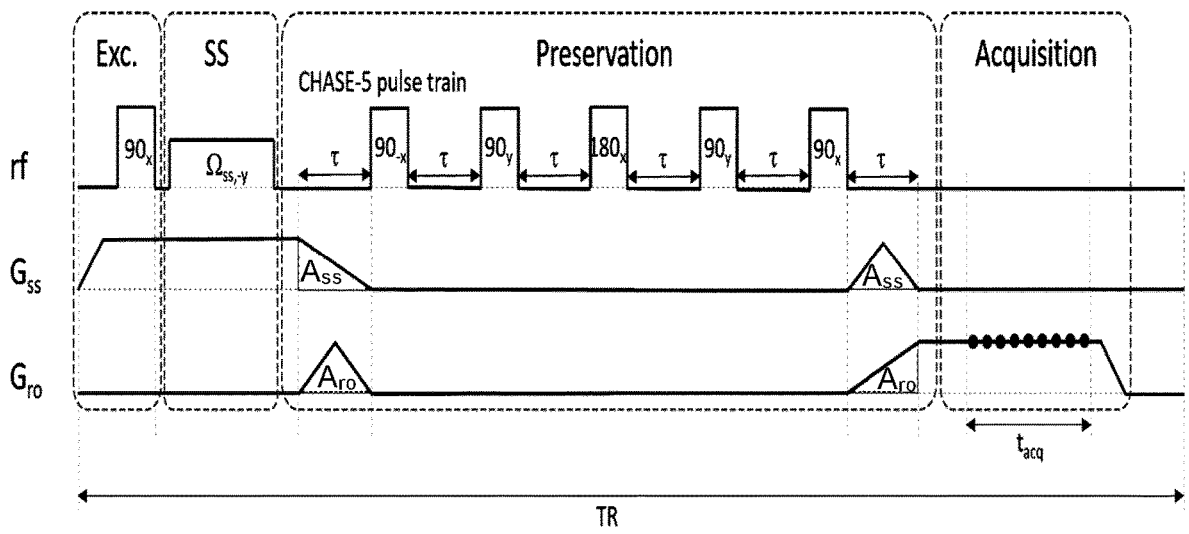
FIG. 4 displays a possible embodiment of SS-ZTE sequence shown in FIG. 1, wherein the preservation (P) step includes a CHASE pulse train of length 5, allowing for zero dead time before data acquisition.

In another preferred embodiment of the invention, summarized in FIG. 4, the CHASE sequence is a single CHASE-5 pulse train and $G_{SS}$ is ramped down linearly before the first 90° pulse and blipped after the last one, while $G_{ro}$ is first blipped and then ramped up. Here, the areas $A_{SS}$ and $A_{ro}$ must be the same in the ramp and the blip, but $A_{SS}$ is not necessarily equal to $A_{ro}$.

Finally, the FID signal detection and data acquisition take place in the acquisition (A) step (denoted as a sequence of dots in FIG. 3 and FIG. 4), after the onset of the readout gradient and the termination of the slice selection gradient in the preservation (P) step. As usual in ZTE sequences, the acquisition starts a dead time td after the last rf pulse (see FIG. 3). In the CHASE embodiment, this td coincides with the start of acquisition (A) step, which encodes directly from k=0 in k-space.

In a preferred embodiment of the invention, the preservation (P) step is implemented with an MS pulse as in FIG. 3, wherein the dead time (td) is long enough to switch the rf electronics from transmission to reception mode, therefore leaving an unsampled gap at the center of k-space; If td is small, a ZTE encoding sequence can be used. If it is too big, the acquisition (A) step can comprise a pointwise k-space center sampling, similarly to standard PETRA technique.

Another particularly advantageous embodiment of the preservation (P) step is implemented by means of a CHASE pulse, as displayed in FIG. 4, so that td can be incorporated into the waiting time between pulses (τ), thereby leaving no gap at the center of k-space.

The following paragraphs describe some experimental results obtained through different embodiments of the invention.

Figure 5:
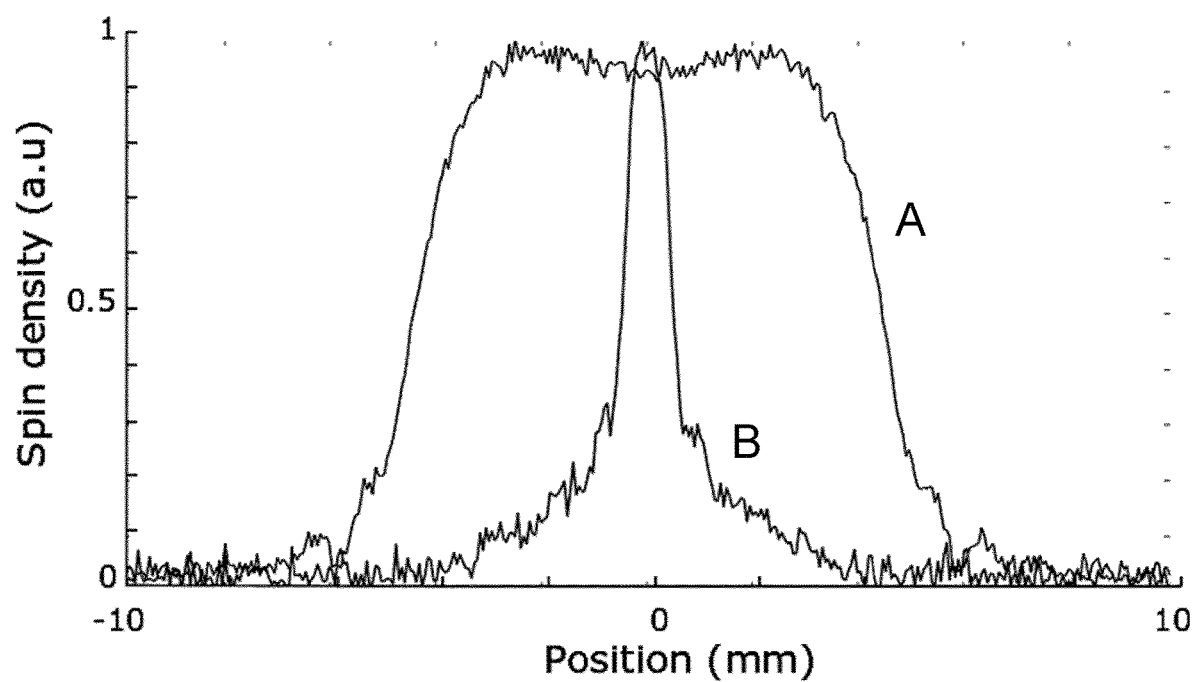
FIG. 5 shows how the slice selection (SS) step is performed applying a bare spin locking pulse with a sample consisting of a test tube filled with a dissolution of copper sulphate.

In order to illustrate the slice selection capability of SS-ZTE sequence, FIG. 5 displays an experimental demonstration with a test tube filled with a dissolution of copper sulfate as a sample, set in a reference magnetic field of $B0 \approx 0.3$ T and a Larmor frequency $\omega L \approx 2\pi \cdot 14$ MHz. If the excitation (E) step was immediately followed by an acquisition (A) step in which the readout is performed along the slice selection direction ($Gro=Gss \approx 50$ mT/m), then the one-dimensional (1D) profile of the reconstruction (measured as spin density) would stand for the full width of the test tube ($\approx 9$ mm, see FIG. 5A). Nevertheless, by taking into account a bare SL pulse of $\Omega ss \approx 2\pi \cdot 2.5$ kHz and duration equal to 500 µs included in the slice-selection (SS) step, it narrows the 1D line profile up to a width of 1 mm (see FIG. 5B).

Figure 6:
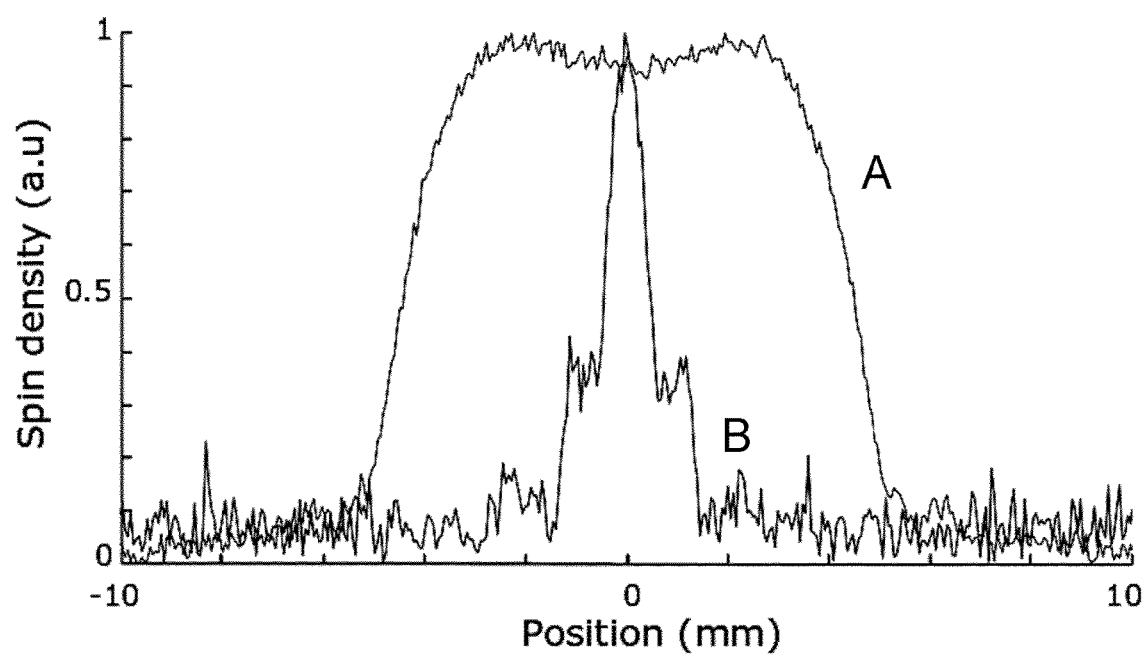
FIG. 6 shows how the slice selection (SS) step with the same sample and conditions as in FIG. 5 but replacing the bare spin locking pulse with a rotary echo spin locking pulse.

Finally, another example of SS-ZTE application is shown in FIG. 6. Here, the previous experiment from FIG. 5 is repeated, but with a rotary echo SL pulse rather than a bare spin locking pulse. FIG. 6A, again, stands for the full width of the test tube, while the 1D line profile boundaries of the selected slice (FIG. 6F) turns out to be sharper in this case, because the effect of applied rf field (B1) inhomogeneities is suppressed by the rotary echo configuration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A magnetic resonance imaging, MRI, method comprising a sample set in a magnetic field, B0, along a longitudinal direction so that the magnetization of the sample is initially parallel to said direction of the magnetic field, wherein said method comprises performing an imaging scan of a sample based on a ZTE sequence, the imaging scan comprising the following steps:
a) applying a slice selection gradient pulse, $G_{SS}$, followed by at least one radio frequency excitation pulse generating a transverse magnetization of the sample with respect to the direction of B0;
b) applying a slice selection pulse sequence comprising at least one rf pulse for selective locking of sample magnetization corresponding to a single 2D slice of the sample;
c) applying a preservation pulse sequence comprising at least one rf pulse, for keeping magnetization coherence of the selected 2D slice, and additionally comprising the termination of $G_{SS}$ and the onset of a readout gradient pulse, $G_{ro}$;
d) performing the encoding, readout, and acquisition of the FID signal of a sample radial spoke defined by $G_{ro}$;
e) repeating the steps (a-d) along a plurality of readout directions in order to gather a corresponding number of radial spokes in the k-space plane, corresponding to the 2D slice of the sample;
f) processing the FID signals gathered in steps a)-e) and reconstructing an image of the 2D slice of the sample.

2. The MRI method according to claim 1, wherein the slice selection pulse sequence comprises a standard spin locking pulse.

3. The MRI method according to claim 1, wherein the slice selection pulse sequence comprises at least one rotary echo SL pulse.

4. The MRI method according to claim 1, wherein both the excitation and slice selection pulse sequences are merged into a homonuclear dipolar-decoupled version of a DANTE selective-excitation sequence.

5. The MRI method according to claim 1, wherein the preservation pulse sequence starts with a hard rf pulse which rotates the transverse component of the magnetization to the longitudinal axis and, once the magnetization is longitudinal, the $G_{SS}$ gradient is ramped to zero and the readout gradient $G_{ro}$ is ramped in a perpendicular image-encoding direction; followed by an excitation rf pulse which rotates the sample magnetization towards the transverse plane.

6. The MRI method according to claim 5, wherein the preservation pulse sequence comprises an additional spoiler gradient pulse, interleaved between the termination of $G_{SS}$ and the onset of $G_{ro}$; being this additional spoiler gradient ramped up and then down, to further spoil coherence of magnetization outside the selected 2D slice.

7. The MRI method according to claim 1, wherein the preservation pulse sequence comprises a CHASE sequence.

8. The MRI method according to claim 7, wherein the CHASE sequence is a single CHASE-5 pulse train; and additionally, the $G_{SS}$ is ramped down linearly before the first 90° pulse and blipped after the last one, while $G_{ro}$ is first blipped and then ramped up.

9. The MRI method according to claim 5 comprising a dead time, td, before acquisition; along with an acquisition step following a ZTE scheme.

10. The MRI method according to claim 7, wherein a dead time, td, is incorporated into the waiting time between pulses of the preservation pulse sequence; along with an acquisition step following a ZTE scheme.

11. The MRI method according to claim 1, wherein the sample comprises a hard tissue with T2 below 1 ms.

12. The MRI method according to claim 11, wherein the hard tissue comprises bone tissue, and/or tendon tissue.

13. The MRI method according to claim 11, wherein the hard tissue comprises teeth bone tissue.

14. An MRI apparatus comprising:
 a magnet operable to provide a magnetic field;
 a rf transmitter configured to transmit a rf field to a sample placed into the magnetic field;
 a rf receiver arranged to receive a magnetic resonance signal;
 a data acquisition unit to record the magnetic resonance signals; and
 a processor for processing the information provided by the data acquisition unit;
 wherein the rf transmitter is configured to yield ZTE sequences following a method according to claim 1.

15. An MRI apparatus according to claim 14, wherein the rf transmitter and rf receiver are combined in the same physical element.

16. Use of an MRI apparatus according to claim 14 in hard tissue imaging, imaging of archaeological objects, imaging analysis in mineralogy, imaging for gemology certification, soil prospection imaging and imaging analysis of chemical composition of solids.

17. Use of an MRI apparatus according to claim 14 in teeth bone imaging.

* * * * *